US012635252B2

(12) United States Patent　　　　(10) Patent No.:　US 12,635,252 B2
Azmat et al.　　　　　　　　　　　　(45) Date of Patent:　　May 19, 2026

(54) ADJACENT CELL ROUTING RESOURCE CONNECTIVITY

(71) Applicant: QUALCOMM Incorporated, San Diego, CA (US)

(72) Inventors: Raheel Azmat, Cork (IE); Cristian Vasile Pavel, Carrigaline (IE); Vasisht Mantra Vadi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 526 days.

(21) Appl. No.: 18/295,225

(22) Filed: Apr. 3, 2023

(65) Prior Publication Data

US 2024/0332278 A1　　Oct. 3, 2024

(51) Int. Cl.
H10D 89/10　　　(2025.01)
H10D 84/90　　　(2025.01)

(52) U.S. Cl.
CPC ........... H10D 89/10 (2025.01); H10D 84/907 (2025.01); *H10D 84/975* (2025.01); *H10D 84/981* (2025.01)

(58) Field of Classification Search
CPC .... H10D 89/10; H10D 84/975; H10D 84/981; H10D 84/983; H10D 84/985; H10D 84/987; H10D 84/907; G06F 30/392; G06F 30/394
See application file for complete search history.

(56) References Cited

U.S. PATENT DOCUMENTS

| | | | | |
|---|---|---|---|---|
| 8,217,469 | B2 * | 7/2012 | Hou ..................... | H10D 84/038 |
| | | | | 257/341 |
| 9,437,588 | B1 * | 9/2016 | Zeng ..................... | H01L 23/528 |
| 2009/0167394 | A1 * | 7/2009 | Bosshart .............. | H10D 84/907 |
| | | | | 327/203 |
| 2020/0152617 | A1 * | 5/2020 | Chang ................... | G06F 30/392 |
| 2020/0159984 | A1 * | 5/2020 | Do ........................ | G06F 30/398 |

* cited by examiner

*Primary Examiner* — John P. Dulka
(74) *Attorney, Agent, or Firm* — Procopio, Cory, Hargreaves & Savitch LLP

(57)　　　　　ABSTRACT

An IC includes a first cell including a first cell net unconnected within the first cell. The IC also includes at least one cell adjacent the first cell. The at least one cell includes a first interconnect unconnected to any nets within the at least one cell. The first cell net is connected together through the first interconnect. The first cell net may be on at least one of a first metal layer, a second metal layer, or a third metal layer. The first cell and the at least one cell may be adjacent to each other in a first direction. The first interconnect may extend in a second direction orthogonal to the first direction. The IC may further include second and third interconnects extending in the first direction between first and second parts, respectively, of the first cell net and the first interconnect.

20 Claims, 13 Drawing Sheets

2<sup>nd</sup> direction (y, vertical)

1<sup>st</sup> direction (x, horizontal)

layers (z)
3<sup>rd</sup> direction

200

M1

216

V0

218

M0

212

Via

208

Contact

214

210

Contact drain

206 fins

202 gate source    204

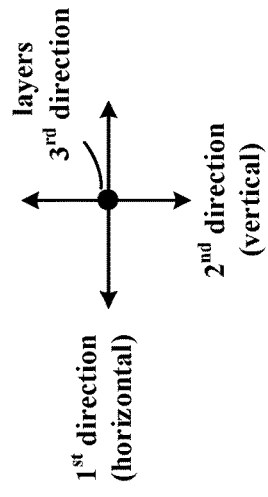
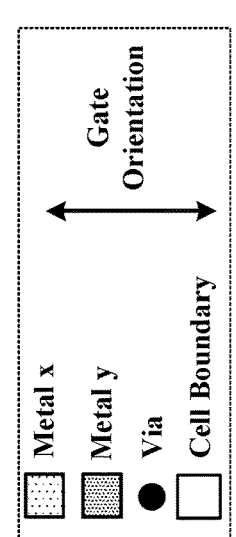
FIG. 10D
FIG. 10E

ADJACENT CELL ROUTING RESOURCE CONNECTIVITY

TECHNICAL FIELD

The present disclosure relates generally to a standard/logic cell architecture, and more particularly, to standard cell design for routability improvements for an ultra-high dense (UHD) standard/logic cell architecture.

INTRODUCTION

A standard cell device is an integrated circuit (IC) that implements digital logic. Such standard cell device may be reused multiple times within an application-specific IC (ASIC). An ASIC, such as a system-on-a-chip (SoC) device, may contain thousands to millions of standard cell devices. A typical IC includes a stack of sequentially formed layers. Each layer may be stacked or overlaid on a prior layer and patterned to form the shapes that define transistors (e.g., field effect transistors (FETs) and/or fin FETs (FinFETs)) and connect the transistors into circuits.

In a UHD cell architecture, issues may arise due to higher metal congestion, thereby limiting the amount of metal routing resources. The size of a cell may be increased to include more metal routing resources. However, this may increase the overall size of the IC. There is a need for an UHD cell that can provide area savings in order to reduce the overall size of an IC.

BRIEF SUMMARY

In an aspect of the disclosure, an IC includes a first cell including a first cell net unconnected within the first cell. The IC also includes at least one cell adjacent the first cell. The at least one cell includes a first interconnect unconnected to any nets within the at least one cell. The first cell net is connected together through the first interconnect.

BRIEF DESCRIPTION OF THE DRAWINGS

FIG. 10D depicts a fourth configuration for forming a net connection utilizing a metal resource outside of a cell boundary in a horizontal direction in accordance with various aspects of the present disclosure.

FIG. 10E depicts a fifth configuration for forming a net connection utilizing a metal resource outside of a cell boundary in a horizontal direction in accordance with various aspects of the present disclosure.

DETAILED DESCRIPTION

Various aspects relate generally to a logic cell architecture. Some aspects more specifically relate to routability improvements in a UHD logic cell architecture. In some examples, one or more metal resources (e.g., interconnects) that are outside a boundary of a first particular cell may be utilized to connect nets that are unconnected within the boundary of the first cell. Specifically, instead of increasing an area of a first cell in order to connect all the nets via intra-cell routing interconnects within the first cell, one or more nets in the first cell may be connected together through unused interconnects of one or more neighboring cells. That is, metal resources located in one or more neighboring cells (e.g., cell(s) adjacent to the first cell) that are unconnected to any nets within the one or more neighboring cells may be utilized to connect nets together of the first cell.

Particular aspects of the subject matter described in this disclosure can be implemented to realize one or more of the following potential advantages. In some examples, by using unutilized interconnects of neighboring cells, an area footprint of existing layouts of UHD architecture may be reduced. Accordingly, an overall footprint area of an integrated circuit (IC) may be reduced. Utilizing such techniques may provide an overall footprint area savings for an IC of around 16%.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

Figure 1:
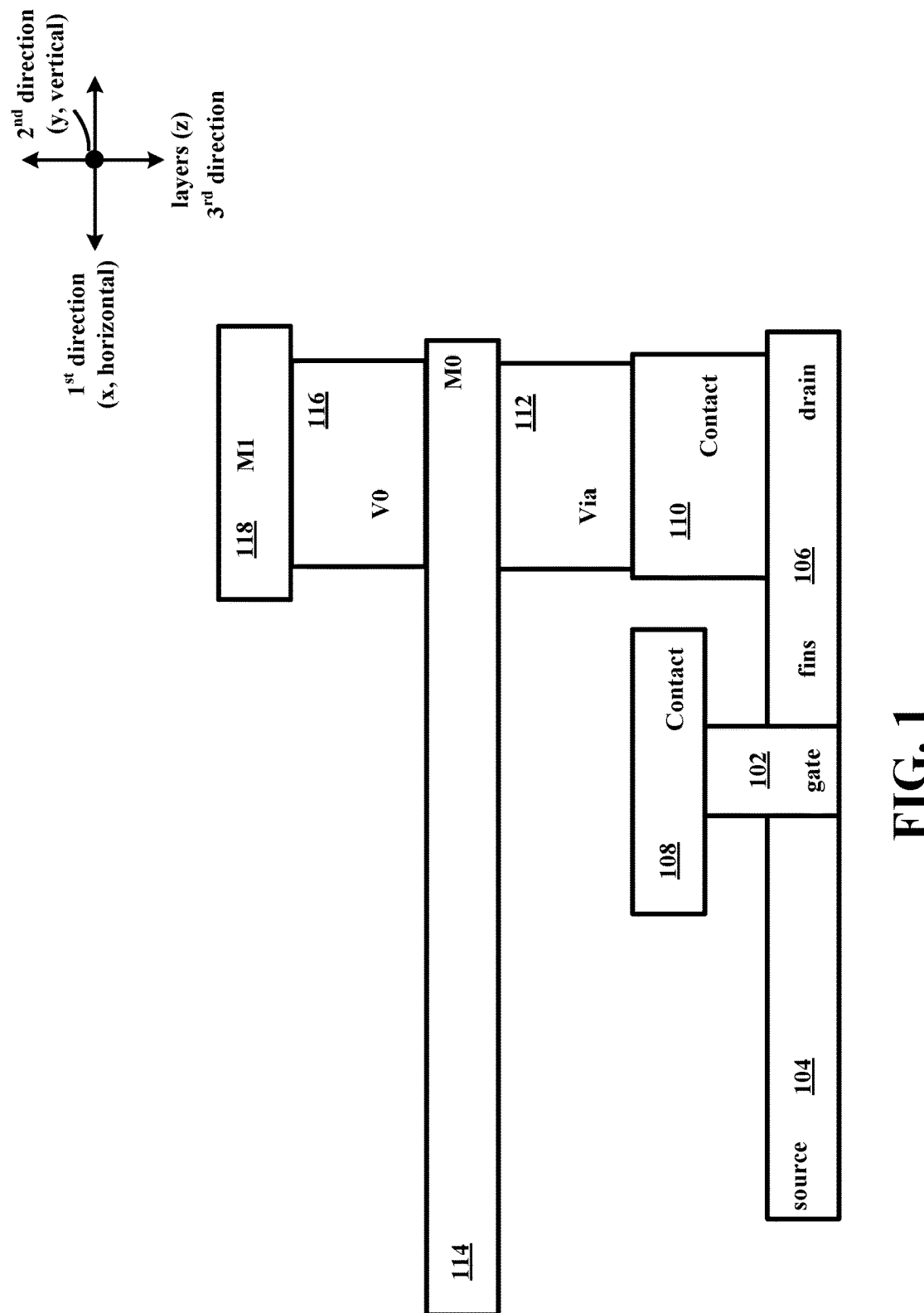
FIG. 1 is a first diagram illustrating a side view of various layers within an IC.

FIG. 1 is a first diagram 100 illustrating a side view of various layers within a cell device and IC. The various layers change in the z direction (labeled as the $3^{rd}$ direction). As illustrated in FIG. 1, a transistor has a gate 102 (which may be referred to as POLY in some instances even though the gate may be formed of metal, polysilicon, or a combination of polysilicon and metal), a source 104, and a drain 106. The source 104 and the drain 106 may be formed by fins. The gate 102 may extend in a second direction (e.g., vertical direction along the y axis coming out of the page), and the fins may extend in a first direction orthogonal to the second direction (e.g., horizontal direction along the x axis). A contact layer interconnect 108 (also referred to as a metal POLY (MP) layer interconnect, or contact B (CB) layer interconnect) may contact the gate 102. A contact layer interconnect 110 (also referred to as a metal diffusion (MD) layer interconnect, or contact A (CA) layer interconnect) may contact the source 104 and/or the drain 106. A via 112 (also referred to as via A (VA)) may contact the contact layer interconnect 110. A metal 0 ($M_0$) layer interconnect 114 may contact the via 112. The $M_0$ layer interconnect 114 is illustrated as extending unidirectionally in the first direction, but may also extend in the second direction. A via $V_0$ 116 may contact the $M_0$ layer interconnect 114. A metal 1 ($M_1$) layer interconnect 118 may contact the via $V_0$ 116. The $M_1$ layer interconnect 118 is illustrated as extending unidirectionally in the second direction, but may alternatively extend unidirectionally in the first direction. Higher layers include a via layer including vias $V_1$, a metal 2 ($M_2$) layer including $M_2$ layer interconnects, and higher via/metal layers. The $M_2$ layer and higher layer interconnects may extend in the first direction or the second direction. Metal layers at a metal q ($M_q$) layer and above may extend in both the first and second directions. A cell device may be implemented with FinFETs (as illustrated), GAAFETs, or other multi-gate FETs. For a continuous oxide diffusion (OD) region across multiple devices, the fins are continuous (in the first direction) across the multiple devices. For a discontinuous OD region across multiple devices, the fins are separate at a diffusion break (e.g., single/double diffusion break extending in the second direction) between different sets of the multiple devices.

Figure 2:
FIG. 2 is a second diagram illustrating a side view of various layers within an IC.

FIG. 2 is a second diagram 200 illustrating a side view of various layers within a standard cell and IC. The various layers change in the z direction (labeled as the 3rd direction). As illustrated in FIG. 2, a transistor has a gate 202, a source 204, and a drain 206. The source 204 and the drain 206 may be formed by fins. The gate 202 may extend in a second direction (e.g., vertical direction along the y axis coming out of the page), and the fins may extend in a first direction orthogonal to the second direction (e.g., horizontal direction along the x axis). A contact layer interconnect 208 (also referred to as MP layer interconnect or CB layer interconnect) may contact the gate 202. A contact layer interconnect 210 (also referred to as MD layer interconnect or CA layer interconnect) may contact the source 204 and/or the drain 206. A via 212 (also referred to as via B (VB)) may contact the contact layer interconnect 208. An $M_0$ layer interconnect 214 may contact the via 212. The $M_0$ layer interconnect 214 is illustrated as extending unidirectionally in the first direction, but may also extend in the second direction. A via $V_0$ 216 may contact the $M_0$ layer interconnect 214. An $M_1$ layer interconnect 218 may contact the via $V_0$ 216. The $M_1$ layer interconnect 218 is illustrated as extending unidirectionally in the second direction, but may alternatively extend unidirectionally in the first direction. Higher layers include a via layer including vias $V_1$, an $M_2$ layer including $M_2$ layer interconnects, and higher via/metal layers. The $M_2$ layer and higher layer interconnects may extend in the first direction or the second direction. Metal layers at an $M_q$ layer and above may extend in both the first and second directions. A cell device may be implemented with FinFETs (as illustrated), GAAFETs, or other multi-gate FETs. For a continuous OD region across multiple devices, the fins are continuous (in the first direction) across the multiple devices. For a discontinuous OD region across multiple devices, the fins are separate at a diffusion break (e.g., single/double diffusion break extending in the second direction) between different sets of the multiple devices.

Referring again to FIGS. 1 and 2, the lowest metal layer is illustrated as being layer 0, but alternatively, the lowest metal layer may be identified as layer 1. The lowest metal layer may extend unidirectionally in the horizontal direction. The layer above the lowest metal layer may extend unidirectionally in the vertical direction. The layer two layers above the lowest metal layer may extend unidirectionally in the horizontal direction.

Enablement of an ultra-high dense (UHD) cell architecture may be limited by the layout implementation of complex cells. There are different types of cells based on the density of the design. One type of cell design is based on a UHD standard cell architecture. In UHD, issues may arise due to higher metal congestion. Thus, there are limited metal routing resources available in UHD for standard cell layouts. In particular, each standard cell may be limited by the metal resources within the boundary of the cell. If additional routing resources (e.g., intra-cell routing interconnects (or routing interconnects that are within a cell)) are needed, the boundary of the cell may be increased (either in the X direction (e.g., the horizontal direction) or the Y direction (e.g., the vertical direction)). However, this causes the area of the cell to increase.

In accordance with various aspects described herein, additional metal resources (e.g., interconnects) that are outside a boundary of a first cell may be utilized to connect nets that are unconnected within the boundary of the first cell. Specifically, instead of increasing an area of a first cell in order to connect all the nets via intra-cell routing interconnects within the first cell, one or more nets in the first cell may be connected together through unused interconnects of one or more neighboring cells. That is, metal resources located in one or more neighboring cells (e.g., cell(s) adjacent to the first cell) that are unconnected to any nets within the one or more neighboring cells may be utilized to connect nets together of the first cell. Through the aforementioned technique of using unutilized interconnects of neighboring cells, an area footprint of existing layouts of UHD architecture may be reduced. Accordingly, an overall footprint area of an IC may be reduced. Utilizing such techniques may provide an overall footprint area savings for an IC of around 16%.

Figure 3:
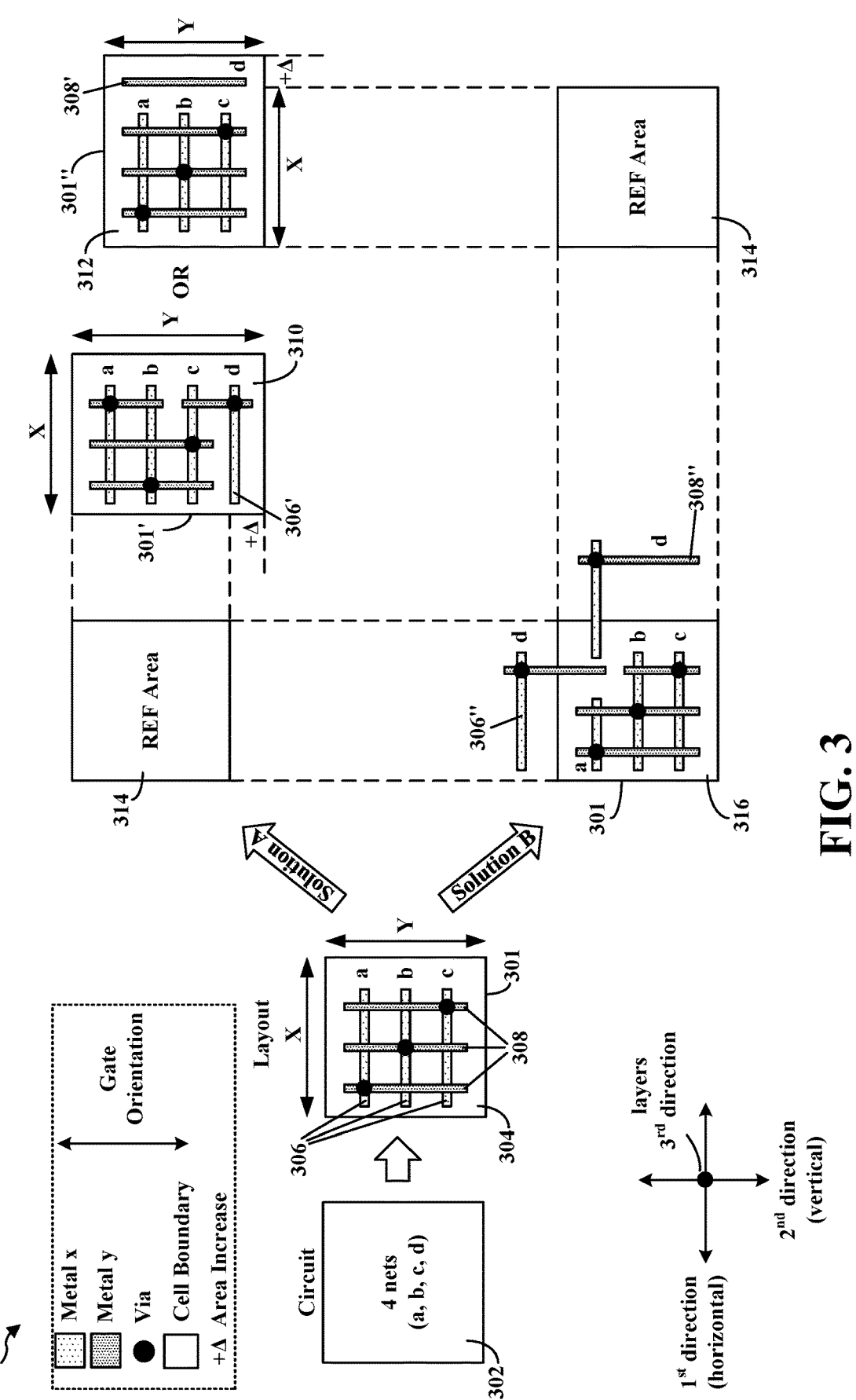
FIG. 3 is a diagram illustrating different solutions for connecting a net of a cell for a UHD layout in accordance with various aspects of the present disclosure.

FIG. 3 is a diagram 300 illustrating different solutions for connecting a net of a cell for a UHD layout. As shown in FIG. 3, a circuit 302 may include a plurality of nets (e.g., 4 nets labeled "a," "b", "c," and "d" in FIG. 3). A net may also be referred to as a cell net. A cell net may correspond to a routing connection (or path) between two components (e.g., logic gates) within a cell. A cell net may include an input into a component, an output from a component, or a connection between an output of one component and an input to another component (referred to as an internal net). When generating a UHD layout 304, there may not be enough routing resources needed to implement all four nets. As shown in FIG. 3, the UHD layout 304 generated for the circuit 302 may include first routing interconnects 306 on a first metal layer that extends in a first direction (e.g., the horizontal direction) and may include second routing interconnects 308 on a second metal layer that extends in a second direction (e.g., the vertical direction) that is orthogonal to the first direction. The second routing interconnects 308 may extend in the same direction as the gates (see 102 and 202 of FIGS. 1 and 2, respectively) of the cell. The second metal layer may be higher than the first metal layer in a third direction (e.g., along an axis coming out of the page). Alternatively, the first metal layer may be higher than the second metal layer in the third direction. As shown in FIG. 3, the UHD layout 304 does not have enough space for the net "d."

One solution (i.e., solution A) is to increase the area of the cell, for example, by extending the cell boundary 301 either in the x direction (e.g., horizontally) or the y direction (e.g., vertically). For instance, as shown in FIG. 3, a layout 310 may be generated for the circuit 302, where the cell boundary has been extended in the y direction (shown as a cell boundary 301'). In the layout 310, another routing interconnect 306' may be added to connect the net "d" due to the increase in area size. In another example, a layout 312 may be generated for the circuit 302, where the cell boundary has been extended in the x direction (shown as a cell boundary 301"). In the layout 312, another second routing interconnect 308' may be added to connect the net "d" due to the increase in area size. One disadvantage to such an approach is that the cell area is increased by an amount Δ when compared to the original area of the cell (shown as the reference ("REF") area 314).

In another solution (i.e., solution B), in accordance with various aspects of the present disclosure, one or more additional metal resources that are outside the cell boundary 301 may be utilized as needed to complete the UHD layout without increasing the standard cell area. The foregoing may be achieved, for example, by utilizing metal resource(s) that are not limited by the cell boundary 301. For instance, unutilized metal tracks from a neighboring cell may be utilized after placement to connect one or more nets of the cell. This may result in no additional area loss. For example, as shown in FIG. 3, a layout 316 may be generated for the circuit 302, where neighboring routing resources either in the x direction (e.g., the routing interconnect 308") or in the y direction (e.g., the routing interconnect 306") outside the cell boundary 301 are utilized to connect the net "d" and complete a single cell layout. This way, the cell boundary 301 may not be increased, as is the case for the first solution described above.

Figure 4:
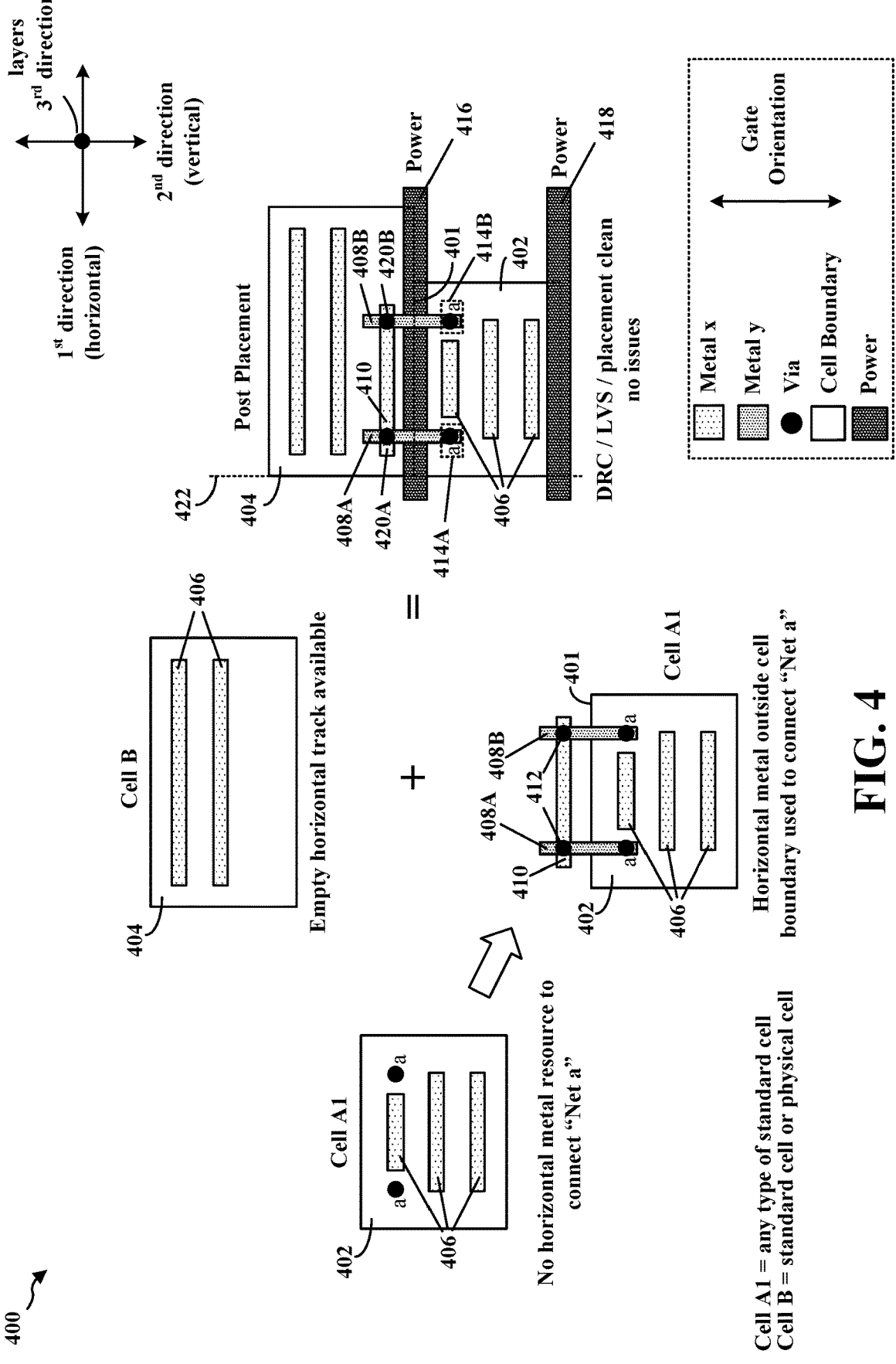
FIG. 4 is a diagram illustrating a net connection utilizing a metal resource outside of a cell boundary in a vertical direction in accordance with various aspects of the present disclosure.

FIG. 4 is a diagram 400 illustrating a net connection utilizing a metal resource outside of a cell boundary in a vertical direction. As shown in FIG. 4, the diagram 400 may include a first cell 402 and a second cell 404. The first cell 402 may be any type of standard cell (e.g., a group of transistor and interconnect structures that provide a Boolean logic function (e.g., AND, OR, XOR, XNOR, an inverter, etc.) or a storage function (e.g., a flip-flop or latch)), a physical cell, or a special cell (e.g., a level shifter, a head switch, a power switch, a retention register, an always-on cell, an isolation cell, etc. The second cell 404 may be any type of standard cell, a physical cell, or a special cell. The first cell 402 may include first routing interconnects 406 on a first metal layer that extends in a first direction (e.g., the horizontal direction) and a net "a" that is unconnected within the first cell 402. The area of the first cell 402 may not be large enough to include a metal resource (e.g., a routing interconnect extending in the first direction) to connect the net "a." However, the second cell 404 may have enough space to include an extra routing interconnect on the first metal layer that extends in the first direction.

To facilitate the connection of the net "a," a routing interconnect 410 outside the cell boundary 401 of the first cell 402 may be utilized to connect the net "a" together through the routing interconnect 410. The routing interconnect 410 may be on the first metal layer that extends in the first direction. The first cell 402 may also include second routing interconnects 408A and 408B on a second metal layer that extends in a second direction (e.g., the vertical direction) that is orthogonal to the first direction. The second routing interconnects 408A and 408B may extend across the cell boundary 401 of the first cell 402 and extend in the same direction as the gates (see 102 and 202 of FIGS. 1 and 2, respectively) of the cell. The second metal layer may be higher than the first metal layer in a third direction (e.g., along an axis coming out of the page). Alternatively, the first metal layer may be higher than the second metal layer in the third direction. Vias 412 may couple the routing interconnect 410 with the second routing interconnects 408A and 408B and the net "a." The net "a" may be on at least one of the first metal layer (e.g., the same metal layer as the first routing interconnects 406), the second metal layer (e.g., the same metal layer as the second routing interconnects 408A and 408B, or another metal layer (e.g., a third metal layer that extends in the same direction as the first metal layer or, alternatively, in the same direction as the second metal layer).

The portion of the cell boundary 401 over which the second routing interconnects 408A and 408B extend may be defined by a power rail 416 extending on the first metal layer between the first cell 402 and the second cell 404. The power rail 416 may extend in the first direction (e.g., the horizontal direction) that is orthogonal to the second routing interconnects 408A and 408B. As shown in FIG. 4, a respective power rail (e.g., the power rail 416 and the power rail 418) may be located at opposite sides of a cell (e.g., the first cell 402) in the second direction. In some aspects, the power rail 416 may be configured to provide a power supply voltage (Vdd), and the power rail 418 may be configured to provide a ground voltage (Vss). In other aspects, the power rail 416 may be configured to provide a ground voltage (Vss), and the power rail 418 may be configured to provide a power supply voltage (Vdd). The power rails 416, and 418 provide the power supply voltage Vdd and the ground voltage Vss to the n-type metal oxide semiconductor (MOS) (nMOS) transistors and p-type MOS (pMOS) transistors, respectively, in the cell.

The first cell 402 and the second cell 404 may be located adjacent to each other in the second direction (e.g., the vertical direction) such that the routing interconnect 410 (which extends in the first direction orthogonal to the second direction) is located within the second cell 404. In particular, the routing interconnect 410 is located in a location of the second cell 404 that was previously empty (i.e., included no routing interconnect on the first metal layer). In addition, a first portion of the second routing interconnects 408A and 408B may be located within the first cell 402 and a second portion of the second routing interconnects 408A and 408B may be located within the second cell 404.

As shown in FIG. 4, the second routing interconnect 408A may extend in the second direction (i.e., vertically) between a first part 414A of the net "a" and the routing interconnect 410, and the second routing interconnect 408B may extend in the second direction between a second part 414B of the net "a" and the routing interconnect 410. For instance, the second routing interconnect 408A may extend between the first part 414A of the net "a" and a first part (e.g., a first end) 420A of the routing interconnect 410, and the second routing interconnect 408B may extend between the second part 414B of the net "a" and a second part (e.g., a second end) 420B of the routing interconnect 410 that is different than the first part. Because there was space available in the second cell 404 for the routing interconnect 410, the placement of the first cell 402 and the routing interconnect 410 with respect to the second cell 404 is clean and may not raise any design rule checking (DRC) or layout versus schematic (LVS) violations.

Figure 5:
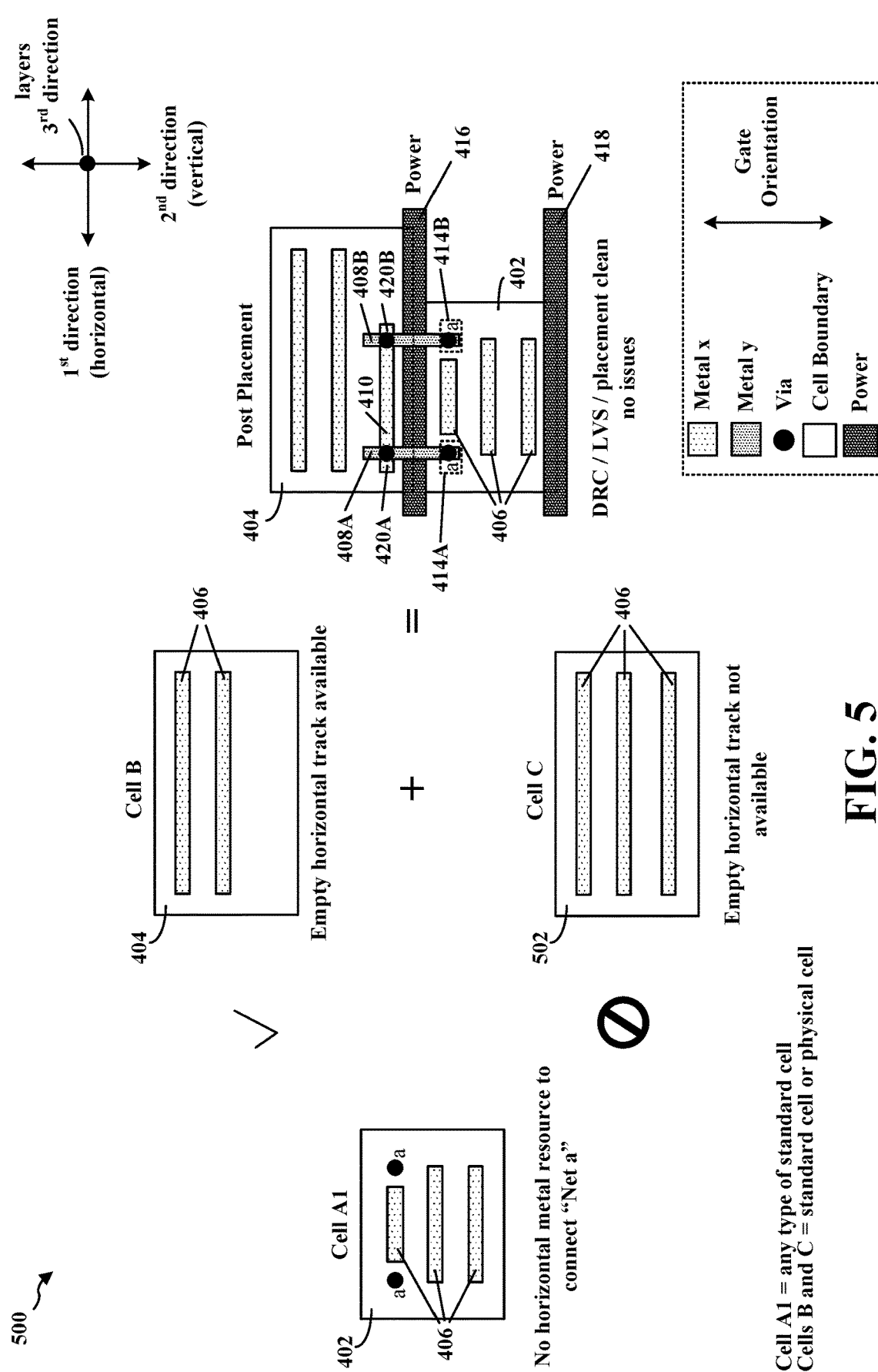
FIG. 5 is diagram illustrating a cell that may not be utilized for connecting nets located in another cell in accordance with various aspects of the present disclosure.

However, attempting to utilize a cell in which no space is available may result in one or more DRC or LVS violations, as there would be no room to include the routing interconnect 410. For example, FIG. 5 is diagram 500 illustrating a cell that may not be utilized for connecting cell nets located in another cell. As shown in FIG. 5, a cell 502 may not have enough available space to include an additional metal resource (e.g., the routing interconnect 410) due to the additional first routing interconnect 406 included therein. Accordingly, the cell 502 would not be a good candidate for the net "a" of the first cell 402.

Figures 6A, 6B, 6C:
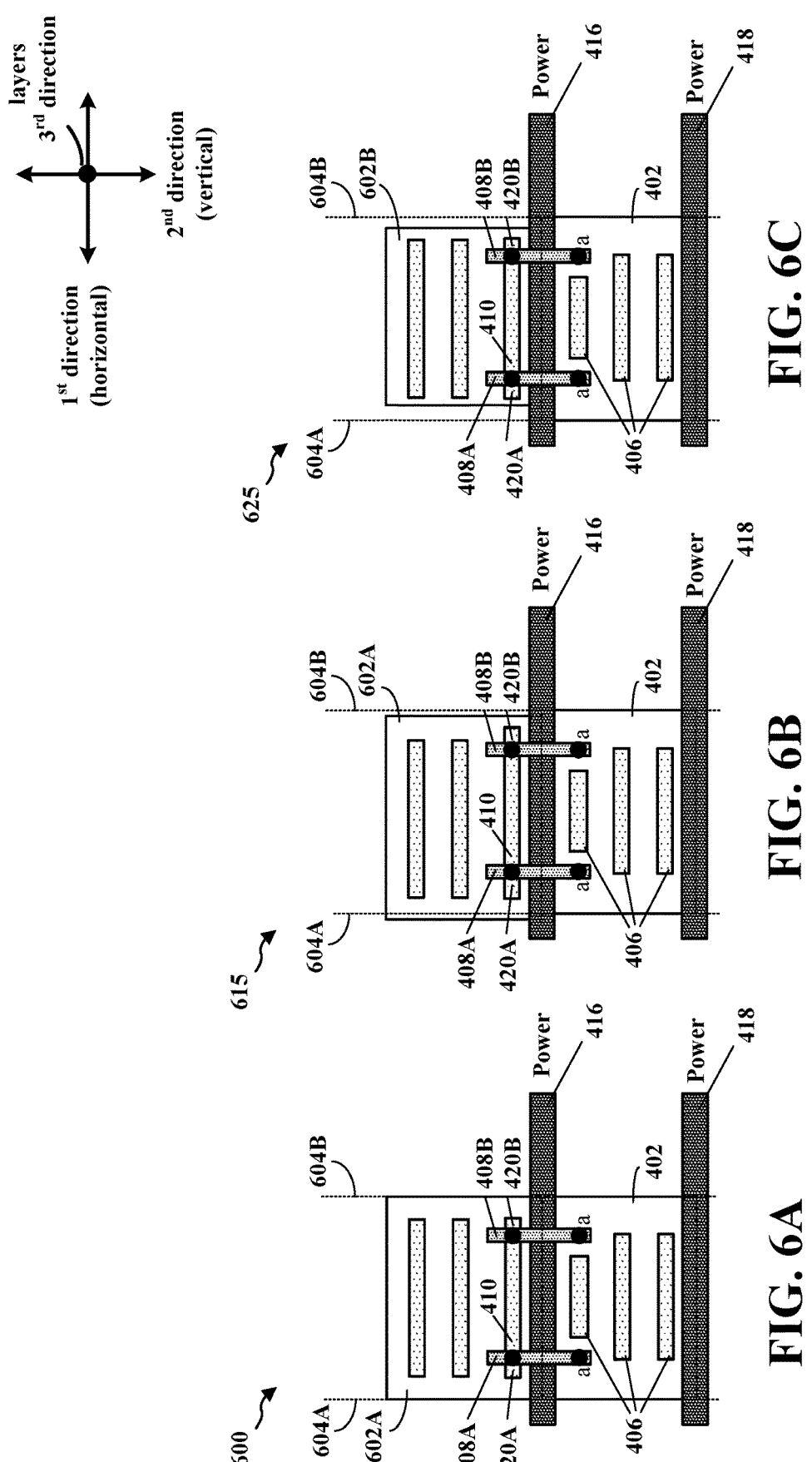
FIG. 6A depicts a first configuration for forming a cell net connection utilizing a metal resource outside of a cell boundary in a vertical direction in accordance with various aspects of the present disclosure in accordance with various aspects of the present disclosure.
FIG. 6B depicts a second configuration for forming a net connection utilizing a metal resource outside of a cell boundary in a vertical direction in accordance with various aspects of the present disclosure.
FIG. 6C depicts a third configuration for forming a net connection utilizing a metal resource outside of a cell boundary in a vertical direction in accordance with various aspects of the present disclosure.

Referring again to FIG. 4, it is noted that while two cells (e.g., the first cell 402 and the second cell 404) have different sizes and are aligned at an edge 422 that extends in the second direction, the two cells may be the same size and/or may not be aligned to a particular edge extending in the second direction. Moreover, more than two cells may be utilized to connect a net located in a particular cell. For example, FIGS. 6A-6E are diagrams 600, 615, 625, 635, and 645 illustrating various configurations for forming a cell net connection utilizing a metal resource outside of a cell boundary in a vertical direction in accordance with various aspects of the present disclosure. As shown in FIG. 6A, the first cell 402 and a second cell 602A may have the same size and dimensions (e.g., they have the same length, width, and height). In addition, the second cell 602A may be aligned with each of edges 606A and 606B of the first cell 402 extending in the second direction. As shown in FIG. 6B, the first cell 402 and the second cell 602A have the same size and dimensions. However, the second cell 602A may not be aligned with either of the edges 606A and 606B. As shown in FIG. 6C, the first cell 402 may be relatively larger than a second cell 602A. In addition, the second cell 602A may not be aligned to any of the edges 606A and 606B of the first cell 402.

Figure 6E:
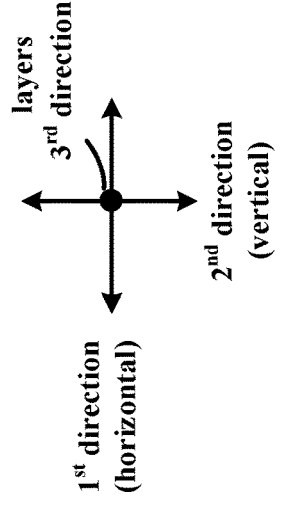
FIG. 6E depicts a fifth configuration for forming a net connection utilizing a metal resource outside of a cell boundary in a vertical direction in accordance with various aspects of the present disclosure.
Figure 6E:
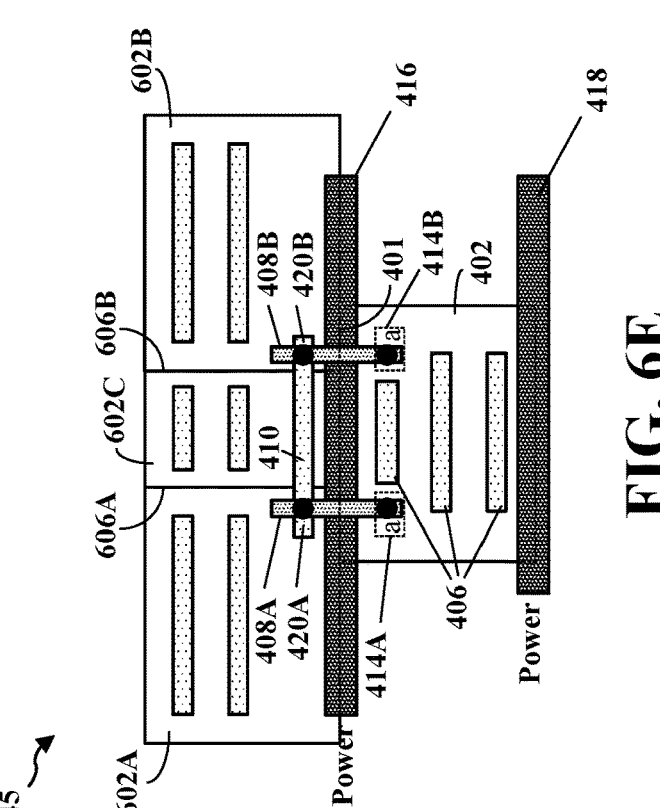
Figure 6D:
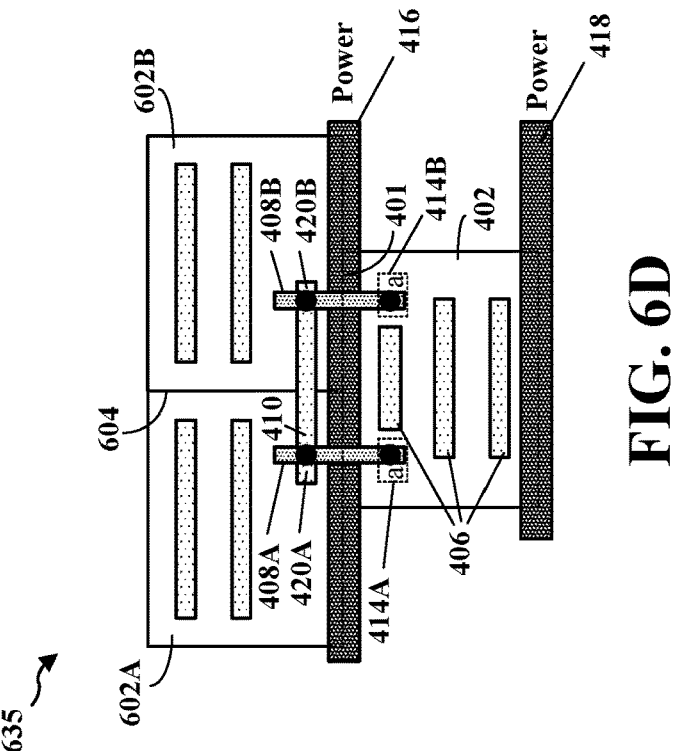
FIG. 6D depicts a fourth configuration for forming a net connection utilizing a metal resource outside of a cell boundary in a vertical direction in accordance with various aspects of the present disclosure.

As shown in FIG. 6D, the routing interconnect 410 may be included in two cells. For example, the routing interconnect 410 may extend in the first direction over a cell boundary 604 between a second cell 602A and a third cell 602B. Accordingly, a first portion of the routing interconnect 410 may be located in the second cell 602A, and a second portion of the routing interconnect 410 may be located in the third cell 602B. The second routing interconnect 408A may extend in the second direction (i.e., vertically) over the cell boundary 401 (e.g., over the power rail 416) between the first part 414A of the net "a" (located in the first cell 402) and the first part 420A of the routing interconnect 410 (located in the second cell 602A), and the second routing interconnect 408B may extend in the second direction over the cell boundary 401 (e.g., over the power rail 416) between the second part 414B of the net "a" (located in the first cell 402) and the second part 420B of routing interconnect 410 (located in the third cell 602B). As will be described below with reference to FIGS. 8A, 8B, 9A, and 9B, a cell boundary between two cells that are adjacent in the first direction (e.g., the cell boundary 604) may be defined by one or more of a break in an OD region, a trench, and/or one or more dummy gate interconnects.

As shown in FIG. 6E, the routing interconnect 410 may be included in three cells. For example, the routing interconnect 410 may extend in the first direction over a cell boundary 604A between the second cell 602A and a fourth cell 602C and may extend in the first direction over a cell boundary 604B between the fourth cell 602C and the third cell 602B. Accordingly, a first portion of the routing interconnect 410 may be located in the second cell 602A, a second portion of the routing interconnect 410 may be located in the third cell 602B, and a third portion of the routing interconnect 410 may be located in the fourth cell 602C. The second routing interconnect 408A may extend in the second direction (i.e., vertically) over the cell boundary 401 (e.g., over the power rail 416) between the first part 414A of the net "a" (located in the first cell 402) and the first part 420A of the routing interconnect 410 (located in a second cell 602A), and the second routing interconnect 408B may extend in the second direction over the cell boundary 401 (e.g., over the power rail 416) between the second part 414B of the net "a" (located in the first cell 402) and the second part 420B of routing interconnect 410 (located in the third cell 602B). It is noted that while the diagrams 635 and 645 depict aspects in which the routing interconnect 410 is included in either two or three cells, respectively, the routing interconnect 410 may be included in any number of cells (e.g., 4, 5, 10, etc.)

Figure 7:
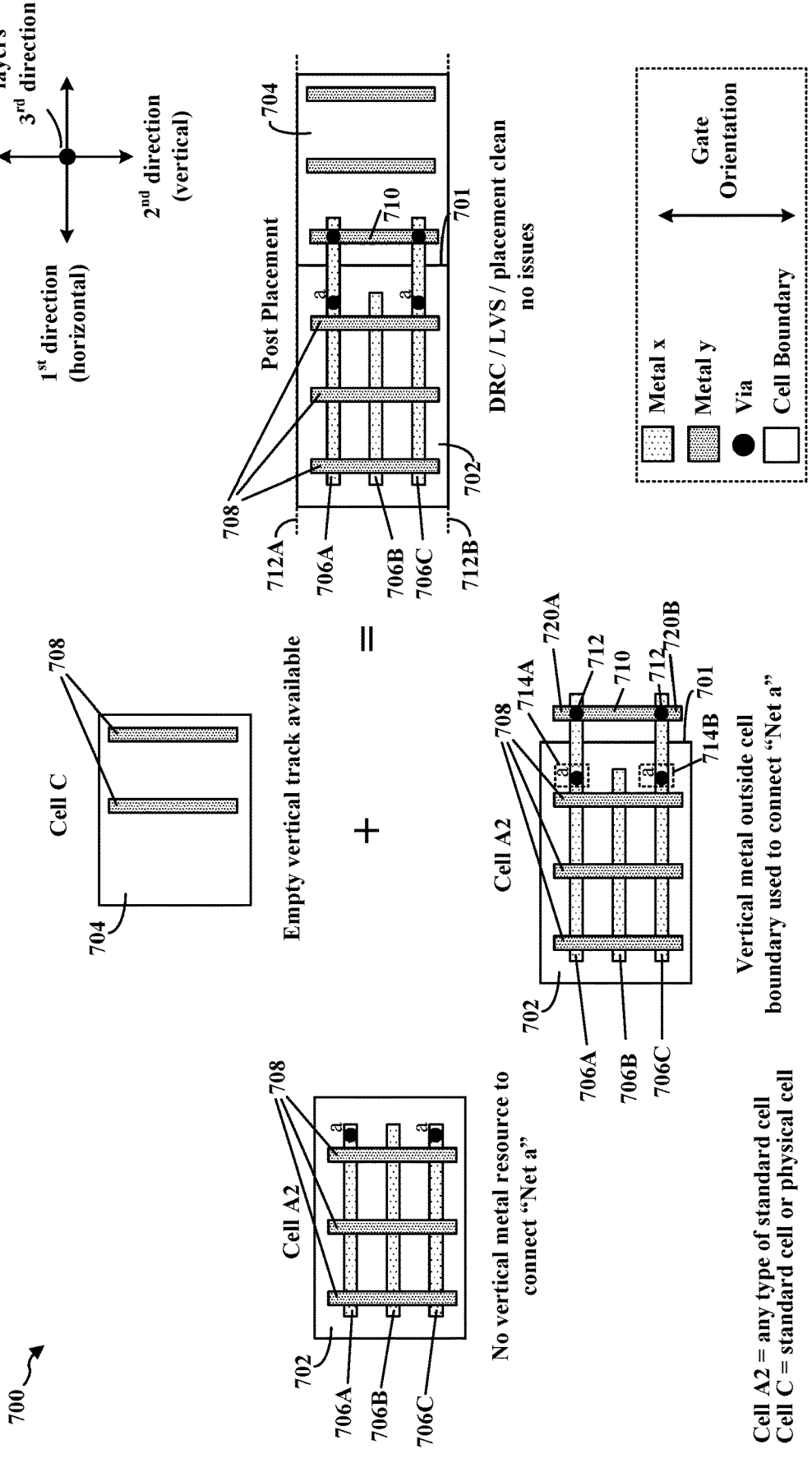
FIG. 7 is a diagram illustrating a net connection utilizing a metal resource outside of a cell boundary in a horizontal direction in accordance with various aspects of the present disclosure.

FIG. 7 is a diagram 700 illustrating a net connection utilizing a metal resource outside of a cell boundary in a horizontal direction. As shown in FIG. 7, the diagram 700 may include a first cell 702 and a second cell 704. The first cell 702 may be any type of standard cell, a physical cell, or a special cell. The second cell 704 may be any type of standard cell, physical cell, or a special cell. The first cell 702 may include first routing interconnects 706A, 706B, and 706C on a first metal layer that extends in a first direction (e.g., the horizontal direction). The first cell 702 may also include one or more second routing interconnects 708 on a second metal layer that extends in a second direction (e.g., the vertical direction) that is orthogonal to the first direction and may extend in the same direction as the gates (see 102, 202 of FIGS. 1, 2) of the cell. The second metal layer may be higher than the first metal layer in a third direction (e.g., along an axis coming out of the page). Alternatively, the first metal layer may be higher than the second metal layer in the third direction. The first cell 702 may further include a net "a" that is unconnected within the first cell 702. The area of the first cell 702 may not be large enough to include a metal resource (e.g., a routing interconnect extending in the second direction) to connect the net "a." However, the second cell 704 may have enough space to include an extra routing interconnect on the second metal layer that extends in the second direction.

To facilitate the connection of the net "a," a routing interconnect 710 outside the cell boundary 701 of the first cell 702 and that extends in the second direction may be utilized to connect the net "a" together through the routing interconnect 710. For example, to connect the net "a," one or more of the first routing interconnects 706A, 706B, and 706C may extend in the first direction across the cell boundary 701 of the first cell 702. As shown in FIG. 7, the first routing interconnects 706A and 706C may extend in the first direction across the cell boundary 701 of the first cell 702. However, it is noted that any combination of the first routing interconnects 706A, 706B, and 706C may extend in the first direction across the cell boundary 701 of the first cell 702 depending on the location of the net "a."

As shown in FIG. 7, the first routing interconnect 706A may extend in the first direction (i.e., horizontally) between a first part 714A of the net "a" and the routing interconnect 710, and the first routing interconnect 706C may extend in the first direction (i.e., horizontally) between a second part 714B of the net "a" and the routing interconnect 710. For instance, the first routing interconnect 706A may extend between the first part 714A of the net "a" and a first part (e.g., a first end) 720A of the routing interconnect 710, and the routing interconnect 706C may extend between the second part 714B of the net "a" and a second part (e.g., a second end) 720B of the routing interconnect 710 that is different than the first part. Vias 712 may couple the routing interconnect 710 with the first routing interconnects 706A and 706C and the net "a."

The first cell 702 and the second cell 704 may be located adjacent to each other in the first direction (e.g., the horizontal direction) such that the routing interconnect 710 (which extends in the second direction orthogonal to the first direction) is located within the second cell 704. In particular, the routing interconnect 710 is located in a location of the second cell 704 that was previously empty (i.e., that included no routing interconnect on the second metal layer). In addition, a first portion of the first routing interconnect 706A may be located in the first cell 702, and a second portion of the first routing interconnect 706A may be located in the second cell 704. Similarly, a first portion of the first routing interconnect 706C may be located in the first cell 702, and a second portion of the first routing interconnect 706C may be located in the second cell 704.

Because there was space available in the second cell 704 for the routing interconnect 710, the placement of the first cell 702 and the routing interconnect 710 with respect to the second cell 704 is clean and may not raise any DRC or LVS violations.

Figures 8A, 8B:
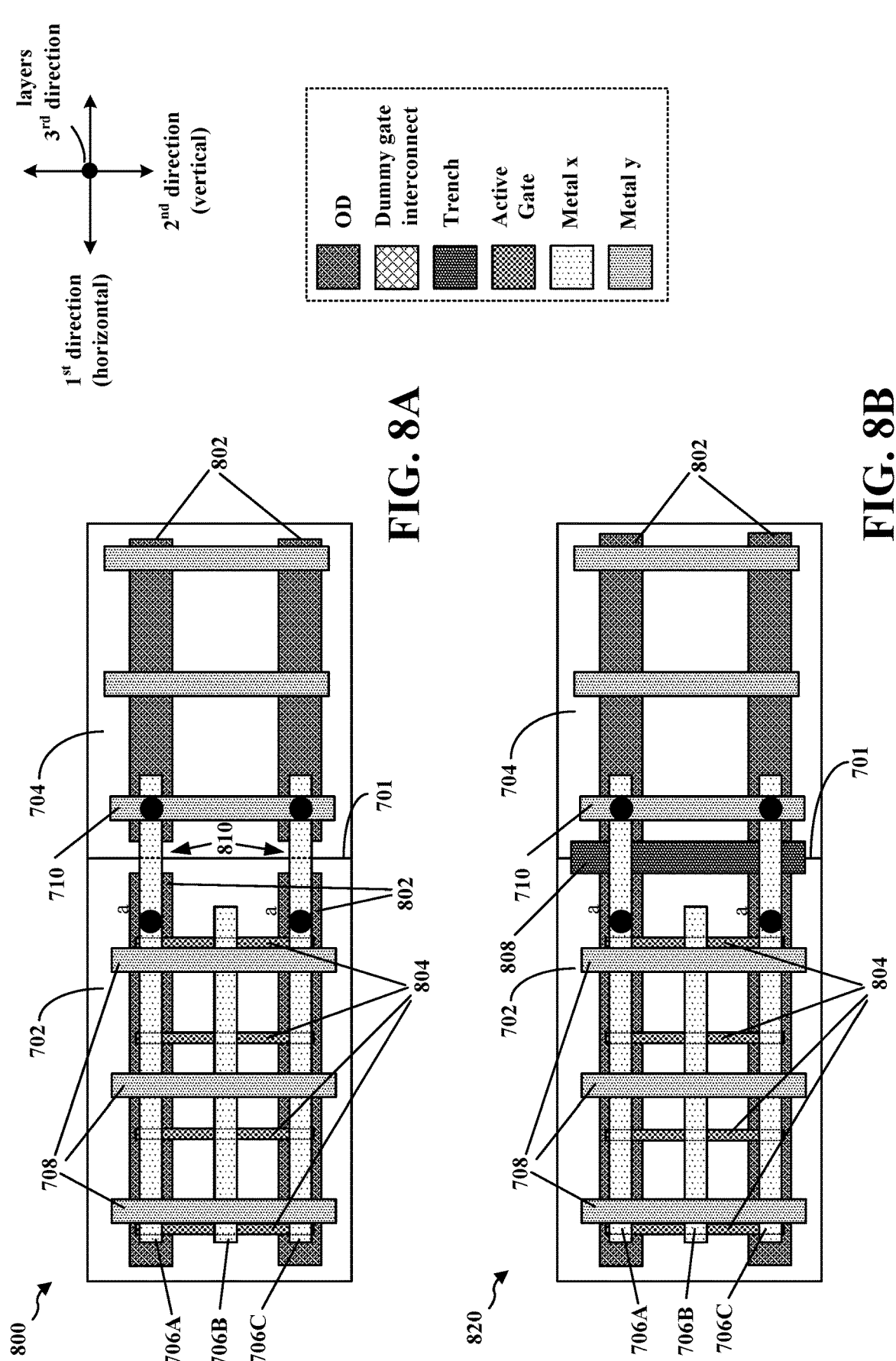
FIG. 8A is a diagram illustrating a cell boundary defined by a break in an oxide diffusion (OD) region between two cells that are adjacent to each other in the horizontal direction in accordance with various aspects of the present disclosure.
FIG. 8B is a diagram illustrating a cell boundary defined by a break in an OD region formed by a trench between two cells that are adjacent to each other in the horizontal direction in accordance with various aspects of the present disclosure.

In some aspects, the portion of the cell boundary 701 over which the first routing interconnects 706A and 706C extend may be defined by at least one of a break in an OD region (e.g., a break in the source 104, the drain 106, the source 204, and the drain 206, each of which may be formed by fins) located at the cell boundary 701 between the first cell 702 and the second cell 704 and/or a trench (e.g., shallow trench isolation (STI) or deep trench isolation (DTI)) located at a cell boundary 701 between the first cell 702 and the second cell 704 to isolate the first and second cells 702, 704 from each other. For example, FIG. 8A is a diagram 800 illustrating a cell boundary defined by a break in an OD region between two cells that are adjacent to each other in the first direction (e.g., the horizontal direction). As shown in FIG. 8A, the first cell 702 and the second cell 704 may include one or more OD regions 802, which extend in the first direction. The first cell 702 may also include one or more active gate interconnects 804 that extend in the second direction over the OD regions 802. As further shown, a break in the OD regions 802 (i.e., an OD break 810) is located at the cell boundary 701 that extends in the second direction between the first cell 702 and the second cell 704. As shown in FIG. 8A, the first routing interconnects 706A and 706C extend in the first direction over the OD break 810.

In some aspects, the OD break 810 may be formed via a trench. For example, FIG. 8B is a diagram 820 illustrating a cell boundary defined by a break in an OD region formed by a trench between two cells that are adjacent to each other in the first direction (e.g., the horizontal direction). As shown in FIG. 8B, a trench 808 may be formed at the cell boundary 701 between the first cell 702 and the second cell 704. The trench 808 may extend in the second direction. The trench 808 may segment each of the OD regions 802, thereby causing a break in the OD regions 802. As shown in FIG. 8B, the first routing interconnects 706A and 706C may extend over the trench 808 in the first direction. The trench 808 may prevent electric current leakage between the first cell 702 and the second cell 704. The trench 808 may be formed utilizing isolation techniques, including, but not limited to local oxidation of silicon (LOCOS)-based techniques, STI-based techniques, DTI-based techniques, and/or the like.

Figures 9A, 9B:
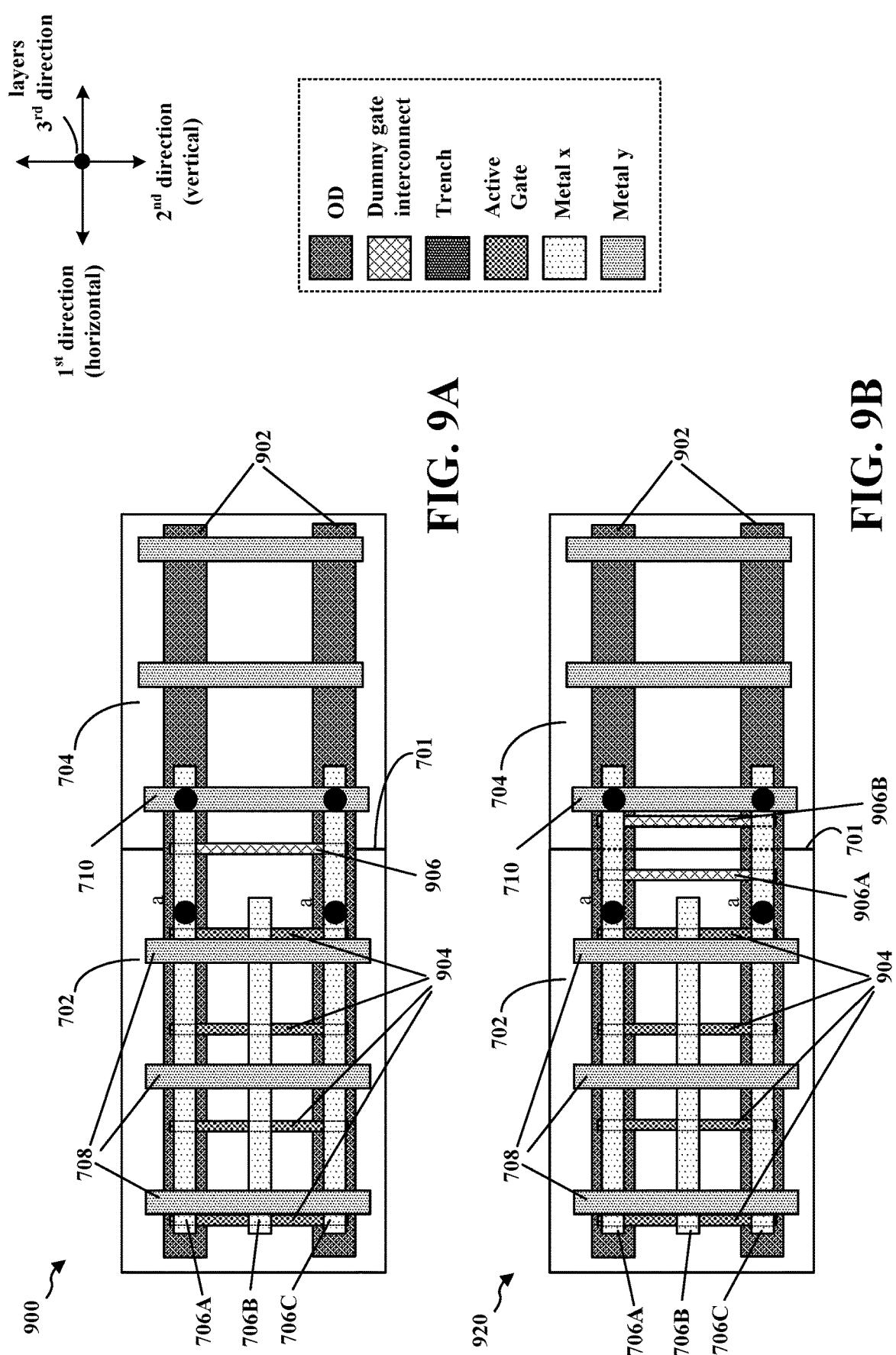
FIG. 9A is a diagram illustrating a cell boundary defined by dummy gate interconnect located on the cell boundary between two cells that are adjacent to each other in the horizontal direction in accordance with various aspects of the present disclosure.
FIG. 9B is a diagram illustrating a cell boundary defined by a set of dummy gate interconnects located adjacent to a cell boundary between two cells that are adjacent to each other in the horizontal direction in accordance with various aspects of the present disclosure.

In some aspects, the portion of the cell boundary 701 over which the first routing interconnects 706A and 706C extend may be defined by a set of one or more dummy gate interconnects located at or adjacent to the cell boundary 701 between the first cell 702 and the second cell 704. For example, FIG. 9A is a diagram 900 illustrating a cell boundary defined by dummy gate interconnect located on the cell boundary between two cells that are adjacent to each other in the first direction (e.g., the horizontal direction). As shown in FIG. 9A, the first cell 702 and the second cell 704 may include one or more OD regions 902, which extend in the first direction. The first cell 702 may also include one or more active gate interconnects 904 that extend in the second direction over the OD region(s) 902. As further shown, a dummy gate interconnect 906 may be located at (e.g., over) the cell boundary 701 between the first cell 702 and the second cell 704. The dummy gate interconnect 906 may extend in the second direction over the OD region(s) 902. As shown in FIG. 9A, the first routing interconnects 706A and 706C may extend in the first direction over the dummy gate interconnect 906. It is noted that in certain aspects, a trench (e.g., the trench 808) extending in the second direction may also be located at the cell boundary 701, as described above with reference to FIG. 8B. In such aspects, the first routing interconnects 706A and 706C may extend in the first direction over the dummy gate interconnect 906 and the trench.

FIG. 9B is a diagram 920 illustrating a cell boundary defined by a set of dummy gate interconnects located adjacent to a cell boundary between two cells that are adjacent to each other in the first direction (e.g., the horizontal direction). As shown in FIG. 9B, a first dummy gate interconnect 906A may be located in the first cell 702 adjacent to the cell boundary 701, and a second dummy gate interconnect 906B may be located in the second cell 704 adjacent to the cell boundary 701. Each of the first dummy gate interconnect 906A and the second dummy gate interconnect 906B may extend in the second direction over the OD region(s) 902. The first dummy gate interconnect 906A and the second dummy gate interconnect 906B may be located on opposite sides of the cell boundary 701. As shown in FIG. 9B, the first routing interconnects 706A and 706C may extend in the first direction over the first dummy gate interconnect 906A, the cell boundary 701, and the second dummy gate interconnect 906B. It is noted that in certain aspects, a trench (e.g., the trench 808) extending in the second direction may also be located at the cell boundary 701, as described above with reference to FIG. 8B. In such aspects, the first routing interconnects 706A and 706C may extend in the first direction over the first dummy gate interconnect 906A, the second dummy gate interconnect 906B, and the trench.

Figures 10A, 10B, 10C:
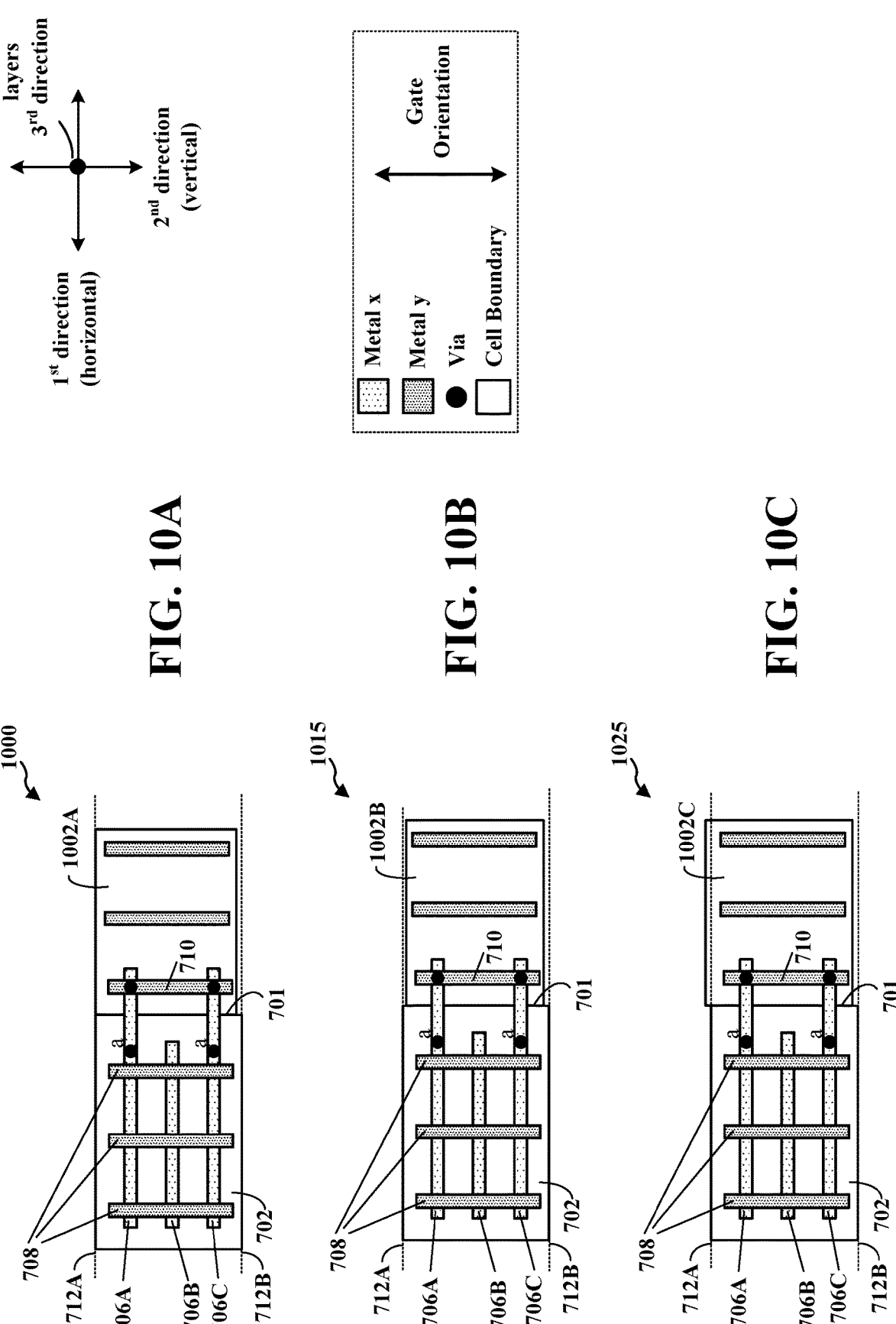
FIG. 10A depicts a first configuration for forming a net connection utilizing a metal resource outside of a cell boundary in a horizontal direction in accordance with various aspects of the present disclosure.
FIG. 10B depicts a second configuration for forming a net connection utilizing a metal resource outside of a cell boundary in a horizontal direction in accordance with various aspects of the present disclosure.
FIG. 10C depicts a third configuration for forming a net connection utilizing a metal resource outside of a cell boundary in a horizontal direction in accordance with various aspects of the present disclosure.

Referring again to FIG. 7, it is noted that while two cells (e.g., the first cell 702 and the second cell 704) have different sizes and are aligned at a first edge 712A and a second edge 712B that extend in the first direction, the two cells may be the same size and/or may not be aligned to a particular edge extending in the second direction. Moreover, more than two cells may be utilized to connect a net located in a particular cell. For example, FIGS. 10A-10E are diagrams 1000, 1015, 1025, 1035, and 1045 illustrating various configurations for forming a net connection utilizing metal resources outside of a cell boundary in a horizontal direction in accordance with various aspects of the present disclosure. As shown in FIG. 10A, the first cell 702 may be relatively larger than a second cell 1002A, and the first cell 702 and the second cell 1002A may have different lengths in the second direction. In addition, the second cell 1002A may be aligned with just the first edge 712A of the first cell 702 and not the second edge 712B of the first cell (or vice versa). As shown in FIG. 10B, the first cell 702 may be relatively larger than a third cell 1002B, and the first cell 702 and the third cell 1002B may have different lengths in the second direction. However, the third cell 1002B may not be aligned with either of the first edge 712A or the second edge 712B extending in the second direction of the first cell 702. As shown in FIG. 10C, the first cell 702 and a fourth cell 1002C may have the same length in the second direction. However, the fourth cell 1002C may not be aligned to either of the first edge 712A or the second edge 712B.

As shown in FIG. 10D, the routing interconnect 710 may be included in two cells. For example, the routing interconnect 710 may extend in the second direction over a cell boundary 1004 (which may be defined by a power rail, as described above with reference to FIG. 4) extending in the first direction between a fifth cell 1002D and a sixth cell 1002E. Accordingly, a first portion of the routing interconnect 710 may be located in the fifth cell 1002D, and a second portion of the routing interconnect 710 may be located in the sixth cell 1002E. The first routing interconnect 706A may extend in the first direction (i.e., horizontally) over the cell boundary 701 between the first part 714A of the net "a" (located in the first cell 702) and the first part 720A of the routing interconnect 710 (located in the fifth cell 1002D), and the first routing interconnect 706C may extend in the first direction (i.e., horizontally) over the cell boundary 701 between the second part 714B of the net "a" (located in the first cell 702) and the second part 720B of routing interconnect 710 (located in the sixth cell 1002E). As described above, the cell boundary 701 may be defined by one or more of a break in an OD region, a trench, and/or one or more dummy gate interconnects.

As shown in FIG. 10E, the routing interconnect 710 may be included in three cells. For example, the routing interconnect 710 may extend in the second direction over a cell boundary 1004A between a seventh cell 1002F and an eighth cell 1002G and may extend in the second direction over a cell boundary 1004B between the eighth cell 1002G and a ninth cell 1002H. The cell boundary 1004A and the cell boundary 1004B may extend in the first direction (e.g., horizontally). Accordingly, a first portion of the routing interconnect 710 may be located in the seventh cell 1002F, a second portion of the routing interconnect 710 may be located in the eighth cell 1002G, and a third portion of the routing interconnect 710 may be located in the ninth cell 1002H. The first routing interconnect 706A may extend in the first direction over the cell boundary 701 between the first part 714A of the net "a" (located in the first cell 702) and the first part 720A of the routing interconnect (located in the seventh cell 1002F), and the first routing interconnect 706C may extend in the first direction (i.e., horizontally) over the cell boundary 701 between the second part 714B of the net "a" (located in the first cell 702) and the second part 720B of routing interconnect 710 (located in the ninth cell 1002H). It is noted that while the diagrams 1035 and 1045 depict aspects in which the routing interconnect 710 is included in either two or three cells, respectively, the routing interconnect 710 may be included in any number of cells (e.g., 4, 5, 10, etc.)

Figure 11:
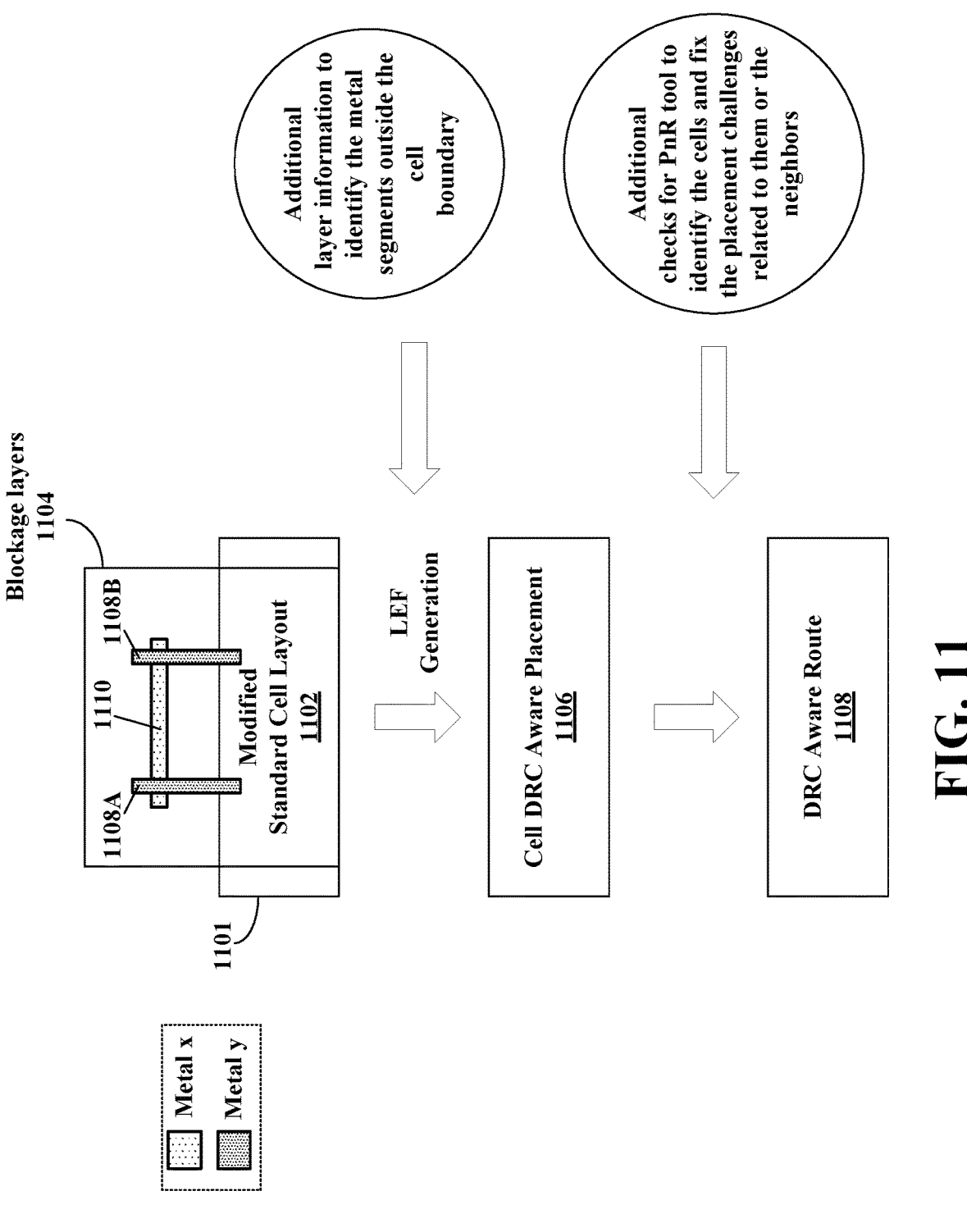
FIG. 11 is a diagram illustrating place and route techniques in accordance with various aspects described herein.

FIG. 11 is a diagram 1100 illustrating place and route (PnR) techniques in accordance with various aspects described herein. As shown in FIG. 11, a modified standard cell layout 1102 may be defined. The modified standard cell layout 1102 may be an example of the first cell 402, as described above. The modified standard cell layout 1102 may include blockage layers 1104. The blockage layers 1104 may include additional metal routing interconnects (or segments) 1108A, 1108B, and 1110 that are outside the cell boundary 1101. The metal routing interconnects 1108A, 1108B, and 1110 may be examples of the second routing interconnects 408A, 408B, and the routing interconnect 410, as respectively described above with reference to FIG. 4.

A file utilized for placement and route may be generated. The file may include additional layer information to identify the metal routing interconnects 1108A, 1108B, and 1110 outside the cell boundary 1101. In some aspects, the file is in accordance with a library exchange format (LEF). The file may be utilized during cell DRC aware placement 1106.

During cell DRC aware placement 1106, a PnR tool (e.g., a software application) may place the modified standard cell layout 1102 adjacent to another cell (e.g., the second cell 404, as described above with reference to FIG. 4) in which space for the additional metal routing interconnects 1108A, 1108B, and 1110 is available.

During DRC aware routing 1108, the PnR tool may perform additional checks to identify the placed cells and fix the placement challenges related to them or neighboring cells. For instance, the PnR tool may adjust the placement of the cells to satisfy certain power-related constraints.

Referring again to FIGS. 4 and 7, an IC includes a first cell 402, 702 including a first cell net "a" unconnected within the first cell 402, 702. In addition, the IC includes at least one cell 404, 704 adjacent the first cell 402, 702. The at least one cell 404, 704 includes a first interconnect 410, 710 unconnected to any nets within the at least one cell 404, 704. The first cell net "a" is connected together through the first interconnect 410, 710.

In one configuration, the first cell net "a" is on at least one of a first metal layer, a second metal layer, or a third metal layer. For example, if the lowest metal layer is identified as layer 0, then the first, second, and third metal layers would be metal layers $M_0$, $M_1$, $M_2$. For another example, if the lowest metal layer is identified as layer 1, then the first, second, and third metal layers would be metal layers $M_1$, $M_2$. $M_3$.

In one configuration, the first cell 402, 702 and the at least one cell 404, 704 are adjacent to each other in a first direction, and the first interconnect 410, 710 extends in a second direction orthogonal to the first direction. In such a configuration, the IC further includes a second interconnect 408A, 706A extending in the first direction between a first part 414A, 714A of the first cell net "a" and the first interconnect 410, 710, and a third interconnect 408B, 706C extending in the first direction between a second part 414B, 714B of the first cell net "a" and the first interconnect.

In one configuration, the second interconnect 408A, 706A extends between the first part 414A, 714A of the first cell net "a" and a first part 420A, 720A of the first interconnect 410, 710, and the third interconnect 408B, 706C extends between the second part 420B, 720B of the first cell net "a" and a second part 420B, 720B of the first interconnect 410, 710.

In one configuration, referring to FIG. 4, the first direction is a vertical direction and the second direction is a horizontal direction.

In one configuration, referring to FIG. 4, the second interconnect 408A and the third interconnect 408B extend over a power rail 416 between the first cell 402 and the second cell 404.

In one configuration, referring to FIG. 4, the second interconnect 408A and the third interconnect 408B are on a first vertical metal layer "Metal y." For example, in an aspect in which the lowest metal layer is identified as layer 0, then the second interconnect 408A and the third interconnect 408B may be on an $M_1$ layer. In an aspect in which the lowest metal layer is identified as layer 1, then the second interconnect 408A and the third interconnect 408B may be on an $M_2$ layer.

In one configuration, referring to FIG. 7, the first direction is a horizontal direction and the second direction is a vertical direction.

In one configuration, referring to FIGS. 8A, 9A, and 9B, the second interconnect 706A and the third interconnect 706C extend over at least one an OD break 810 or a set of dummy gate interconnects 906, 906A, 906B that extend in the second direction.

In one configuration, referring to FIG. 7, the second interconnect 706A and the third interconnect 706C are one of a first horizontal metal layer "Metal x" or a second horizontal metal layer "Metal x." For example, in an aspect in which the lowest metal layer is identified as layer 0, then the second interconnect 706A and the third interconnect 706C may be on one of an $M_0$ or $M_2$ layer. In an aspect in which the lowest metal layer is identified as layer 1, then the second interconnect 706A and the third interconnect 706C may be on one of an $M_1$ or $M_3$ layer.

As discussed supra, additional metal resources (e.g., interconnects) that are outside a boundary of a first cell may be utilized to connect nets that are unconnected within the boundary of the first cell. Specifically, instead of increasing an area of a first cell in order to connect all the nets via intra-cell routing interconnects within the first cell, one or more nets in the first cell may be connected together through unused interconnects of one or more neighboring cells. The one or more unused interconnects of the one or more neighboring cells are unconnected to any intra-cell routing interconnects within the one or more neighboring cells. Specifically, the unused interconnects of the one or more neighboring cells are unconnected to any nets within the one or more neighboring cells. Accordingly, metal resources located in one or more neighboring cells (e.g., cell(s) adjacent to the first cell) that are unconnected to any nets within the one or more neighboring cells may be utilized to connect nets together of the first cell.

Through the aforementioned cell design for routability improvements, the first cell would be non-functional (i.e., a signal at the input of the first cell would not provide a proper output at the output of the first cell) without connecting together the unconnected net(s) within the first cell. The unconnected net(s) are not connected together through intra-cell routing interconnects within the first cell, but rather are connected through inter-cell routing interconnects of one or more adjacent cells, where such inter-cell routing interconnects are unutilized and uncoupled to any nets within the one or more adjacent cells. Through the aforementioned technique of using unutilized interconnects of neighboring cells, an area footprint of existing layouts of UHD architecture may be reduced. Accordingly, an overall footprint area of an IC may be reduced.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B. A and C. B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

The following examples are illustrative only and may be combined with aspects of other implementations or teachings described herein, without limitation.

Aspect 1 is an IC including a first cell including a first cell net unconnected within the first cell; and at least one cell adjacent the first cell, the at least one cell including a first interconnect unconnected to any nets within the at least one cell, the first cell net being connected together through the first interconnect.

Aspect 2 is the IC of aspect 1, where the first cell net is on at least one of a first metal layer, a second metal layer, or a third metal layer.

Aspect 3 is the IC of any of aspects 1 and 2, where the first cell and the at least one cell are adjacent to each other in a first direction, and the first interconnect extends in a second direction orthogonal to the first direction, the IC further including: a second interconnect extending in the first direction between a first part of the first cell net and the first interconnect; and a third interconnect extending in the first direction between a second part of the first cell net and the first interconnect.

Aspect 4 is the IC aspect 3, where the second interconnect extends between the first part of the first cell net and a first part of the first interconnect, and the third interconnect extends between the second part of the first cell net and a second part of the first interconnect.

Aspect 5 is the IC of any of aspects 3 and 4, where the first direction is a vertical direction and the second direction is a horizontal direction.

Aspect 6 is the IC of aspect 5, where the second interconnect and the third interconnect extend over a power rail between the first cell and the at least one cell.

Aspect 7 is the IC of any of aspects 5 and 6, where the second interconnect and the third interconnect are on a first vertical metal layer.

Aspect 8 is the IC of any of aspects 3 and 4, where the first direction is a horizontal direction and the second direction is a vertical direction.

Aspect 9 is the IC of aspect 8, where the second interconnect and the third interconnect extend over at least one of an OD break or a set of dummy gate interconnects that extend in the second direction.

Aspect 10 is the IC of any of aspects 8 and 9, where the second interconnect and the third interconnect are on one of a first horizontal metal layer or a second horizontal metal layer.

What is claimed is:

1. An integrated circuit (IC), comprising:
a first cell including a first cell net comprising a first part unconnected to a second part within the first cell; and
at least one cell adjacent the first cell, the at least one cell including a first interconnect unconnected to any nets within the at least one cell, the first part of the first cell net being connected together to the second part of the first cell net through the first interconnect.

2. The IC of claim 1, wherein the first cell net is on at least one of a first metal layer, a second metal layer, or a third metal layer of the first cell.

3. The IC of claim 1, wherein the first cell and the at least one cell are adjacent to each other in a first direction, and the first interconnect extends in a second direction orthogonal to the first direction, the IC further comprising:
a second interconnect extending in the first direction between the first part of the first cell net and the first interconnect; and
a third interconnect extending in the first direction between the second part of the first cell net and the first interconnect.

4. The IC of claim 3, wherein the second interconnect extends between the first part of the first cell net and a third part of the first interconnect, and the third interconnect extends between the second part of the first cell net and a fourth part of the first interconnect.

5. The IC of claim 3, wherein the first direction is a vertical direction and the second direction is a horizontal direction.

6. The IC of claim 3, wherein the second interconnect and the third interconnect extend over a power rail between the first cell and the at least one cell.

7. The IC of claim 3, wherein the second interconnect and the third interconnect are on a first metal layer that extends in the first direction.

8. The IC of claim 3, wherein the first direction is a horizontal direction and the second direction is a vertical direction.

9. The IC of claim 3, wherein the second interconnect and the third interconnect extend over at least one of an oxide diffusion (OD) break or a set of dummy gate interconnects that extend in the second direction.

10. The IC of claim 3, wherein the second interconnect and the third interconnect are on one of a first metal layer that extends in the first direction or a second metal layer that extends in the first direction.

11. The IC of claim 1, wherein the first cell and the at least one cell are adjacent to each other in a first direction, and the first interconnect extends in a second direction orthogonal to the first direction.

12. The IC of claim 1, further comprising:
a second interconnect that connects the first part within the first cell to the first interconnect within the at least one cell; and
a third interconnect that connects the second part of the first cell to the first interconnect within the at least one cell.

13. A logic cell architecture, comprising:
a first cell;
a cell net within a first boundary of the first cell, wherein the cell net comprises a first part unconnected to a second part;
at least one second cell; and
an interconnect within a second boundary of the at least one second cell, wherein the interconnect is unconnected to any cell nets within the second boundary of the at least one second cell, wherein the interconnect connects the first part of the cell net to the second part of the cell net.

14. The logic cell architecture of claim 13, further comprising:
a second interconnect that connects the first part of the cell net to the interconnect; and
a third interconnect that connects the second part of the cell net to the interconnect.

15. The logic cell architecture of claim 14, wherein the second interconnect is orthogonal to the interconnect, wherein the third interconnect is orthogonal to the interconnect.

16. The logic cell architecture of claim 14, wherein the second interconnect extends between the first part of the cell net within the first boundary of the first cell and a third part of the interconnect within the second boundary of the at least one second cell, wherein the third interconnect extends between the second part of the cell net within the first boundary of the first cell and a fourth part of the interconnect within the second boundary of the at least one second cell.

17. The logic cell architecture of claim 14, wherein the second interconnect and the third interconnect extend over a power rail between the first cell and the at least one second cell.

18. The logic cell architecture of claim 14, wherein the second interconnect and the third interconnect extend over at least one of an oxide diffusion (OD) break or a set of dummy gate interconnects.

19. The logic cell architecture of claim 14, wherein the second interconnect and the third interconnect are on at least one of a first metal layer or a second metal layer, wherein the interconnect is on at least one of the first metal layer, the second metal layer, or a third metal layer.

20. A method of connecting a cell net within a first boundary of a first cell, wherein the cell net comprises a first part unconnected to a second part, comprising:

connecting a first interconnect within a second boundary of at least one second cell to a second interconnect between a third part of the first interconnect and the first part of the cell net; and connecting the first interconnect within the second boundary of the at least one second cell to a third interconnect between a fourth part of the first interconnect and the second part of the cell net.

\* \* \* \* \*